(12) United States Patent
Wang et al.

(10) Patent No.: US 11,798,813 B2
(45) Date of Patent: Oct. 24, 2023

(54) SELECTIVE REMOVAL OF RUTHENIUM-CONTAINING MATERIALS

(71) Applicant: Applied Materials, Inc., Santa Clara, CA (US)

(72) Inventors: Baiwei Wang, Milpitas, CA (US); Xiaolin C. Chen, San Ramon, CA (US); Rohan Puligoru Reddy, San Jose, CA (US); Oliver Jan, Fremont, CA (US); Zhenjiang Cui, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 4 days.

(21) Appl. No.: 17/240,149

(22) Filed: Apr. 26, 2021

(65) Prior Publication Data

US 2022/0344172 A1    Oct. 27, 2022

(51) Int. Cl.
*H01L 21/3213* (2006.01)
*H01L 21/306* (2006.01)
(Continued)

(52) U.S. Cl.
CPC .......... *H01L 21/32136* (2013.01); *C23F 4/02* (2013.01); *H01L 21/02315* (2013.01); *H01L 21/02414* (2013.01); *H01L 21/3065* (2013.01); *H01L 21/30604* (2013.01); *H01L 21/31116* (2013.01); *H01L 21/32135* (2013.01)

(58) Field of Classification Search
None
See application file for complete search history.

(56) References Cited

U.S. PATENT DOCUMENTS

2005/0272238 A1    12/2005  Phillips et al.
2012/0231561 A1*    9/2012  Dolan ............... H01L 21/02071
                                                              438/720
(Continued)

FOREIGN PATENT DOCUMENTS

WO    2020223152 A1    11/2020

OTHER PUBLICATIONS

M.F.J. Vos et al., "Area-selective deposition of ruthenium by combining atomic layer deposition and selective etching", Chemistry of Materials, vol. 31, pp. 3878-3882. (Year: 2019).*

(Continued)

*Primary Examiner* — Jiong-Ping Lu
(74) *Attorney, Agent, or Firm* — Kilpatrick Townsend & Stockton LLP

(57) ABSTRACT

Exemplary etching methods may include flowing an oxygen-containing precursor into a processing region of a semiconductor processing chamber. The methods may include contacting a substrate housed in the processing region with the oxygen-containing precursor. The substrate may include an exposed region of ruthenium, and the contacting may produce ruthenium tetroxide. The methods may include vaporizing the ruthenium tetroxide from a surface of the exposed region of ruthenium. An amount of oxidized ruthenium may remain. The methods may include contacting the oxidized ruthenium with a hydrogen-containing precursor. The methods may include removing the oxidized ruthenium.

17 Claims, 7 Drawing Sheets

(51) Int. Cl.
- *C23F 4/02* (2006.01)
- *H01L 21/02* (2006.01)
- *H01L 21/3065* (2006.01)
- *H01L 21/311* (2006.01)

(56) References Cited

U.S. PATENT DOCUMENTS

| | | |
|---|---|---|
| 2019/0295856 A1 | 9/2019 | Tahara et al. |
| 2020/0243346 A1 | 7/2020 | Zandi et al. |
| 2021/0098267 A1* | 4/2021 | Murakami ........ H01L 21/67063 |
| 2021/0366727 A1* | 11/2021 | Zhang ............... H01L 21/32138 |

OTHER PUBLICATIONS

H. Xiao, Introduction to Semiconductor Manufacturing Technology, SPIE Press, ISBN 978-0-8194-9092-6, pp. 361-362. (Year: 2012).*
Application No. PCT/US2022/023776, International Search Report and Written Opinion, dated Aug. 2, 2022, 10 pages.

* cited by examiner

SELECTIVE REMOVAL OF RUTHENIUM-CONTAINING MATERIALS

TECHNICAL FIELD

The present technology relates to semiconductor processes and equipment. More specifically, the present technology relates to selectively etching ruthenium-containing structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include flowing an oxygen-containing precursor into a processing region of a semiconductor processing chamber. The methods may include contacting a substrate housed in the processing region with the oxygen-containing precursor. The substrate may include an exposed region of ruthenium, and the contacting may produce ruthenium tetroxide. The methods may include vaporizing the ruthenium tetroxide from a surface of the exposed region of ruthenium. An amount of oxidized ruthenium may remain. The methods may include contacting the oxidized ruthenium with a hydrogen-containing precursor. The methods may include removing the oxidized ruthenium.

In some embodiments, the methods may include forming a plasma of the oxygen-containing precursor, wherein plasma effluents are flowed into the processing region. A temperature within the processing region may be maintained at greater than or about 100° C. A temperature within the processing region may be maintained at less than or about 150° C. The hydrogen-containing precursor may be or include diatomic hydrogen. The methods may include contacting the substrate with the hydrogen-containing precursor prior to flowing the oxygen-containing precursor. The hydrogen-containing precursor may expose the region of ruthenium. The processing region may be maintained plasma free throughout the etching method. Removing the oxidized ruthenium may expose additional ruthenium. The method may be repeated for an additional cycle. The ruthenium may be removed selective to an exposed region of silicon oxide, titanium oxide, or tungsten oxide. A pressure within the semiconductor processing chamber may be maintained at greater than or about 1 Torr.

Some embodiments of the present technology may encompass etching methods. The methods may include flowing an oxygen-containing precursor into a processing region of a semiconductor processing chamber. The methods may include contacting a substrate housed in the processing region with the oxygen-containing precursor. the substrate may include an exposed region of ruthenium. The contacting may produce ruthenium tetroxide. The methods may include performing a particle treatment with an inert precursor within the processing region of the semiconductor processing chamber. The methods may include contacting the ruthenium tetroxide with the inert precursor. The methods may include removing the ruthenium tetroxide.

In some embodiments, the methods may include forming a plasma of the oxygen-containing precursor in the processing region or a remote plasma region of the semiconductor processing chamber. A pressure within the semiconductor processing chamber may be maintained at less than or about 25° C. A plasma may be formed of the inert precursor. A plasma power used to form the plasma of the inert precursor may be maintained at less than or about 500 W. Removing the ruthenium tetroxide may expose additional ruthenium. The method may be repeated for an additional cycle. The methods may include contacting the substrate with a hydrogen-containing precursor prior to flowing the oxygen-containing precursor. The hydrogen-containing precursor may expose the region of ruthenium.

Some embodiments of the present technology may encompass etching methods. The methods may include contacting a substrate disposed within a processing region of a semiconductor processing chamber with a hydrogen-containing precursor. the contacting may expose ruthenium metal on the substrate. The methods may include flowing an oxygen-containing precursor into the processing region of the semiconductor processing chamber. The methods may include contacting the ruthenium metal exposed on the substrate with the oxygen-containing precursor. The contacting may produce ruthenium tetroxide. The methods may include vaporizing the ruthenium tetroxide from a surface of the ruthenium metal. In some embodiments, a temperature within the processing region may be maintained at less than or about 150° C. The methods may include forming a plasma of the oxygen-containing precursor within the semiconductor processing chamber. The methods may include repeating the method for at least one additional cycle.

Such technology may provide numerous benefits over conventional systems and techniques. For example, the processes may allow a precisely controlled dry etch to be performed, which may remove discreet layers of ruthenium-containing materials. Additionally, the processes may selectively remove ruthenium-containing films relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
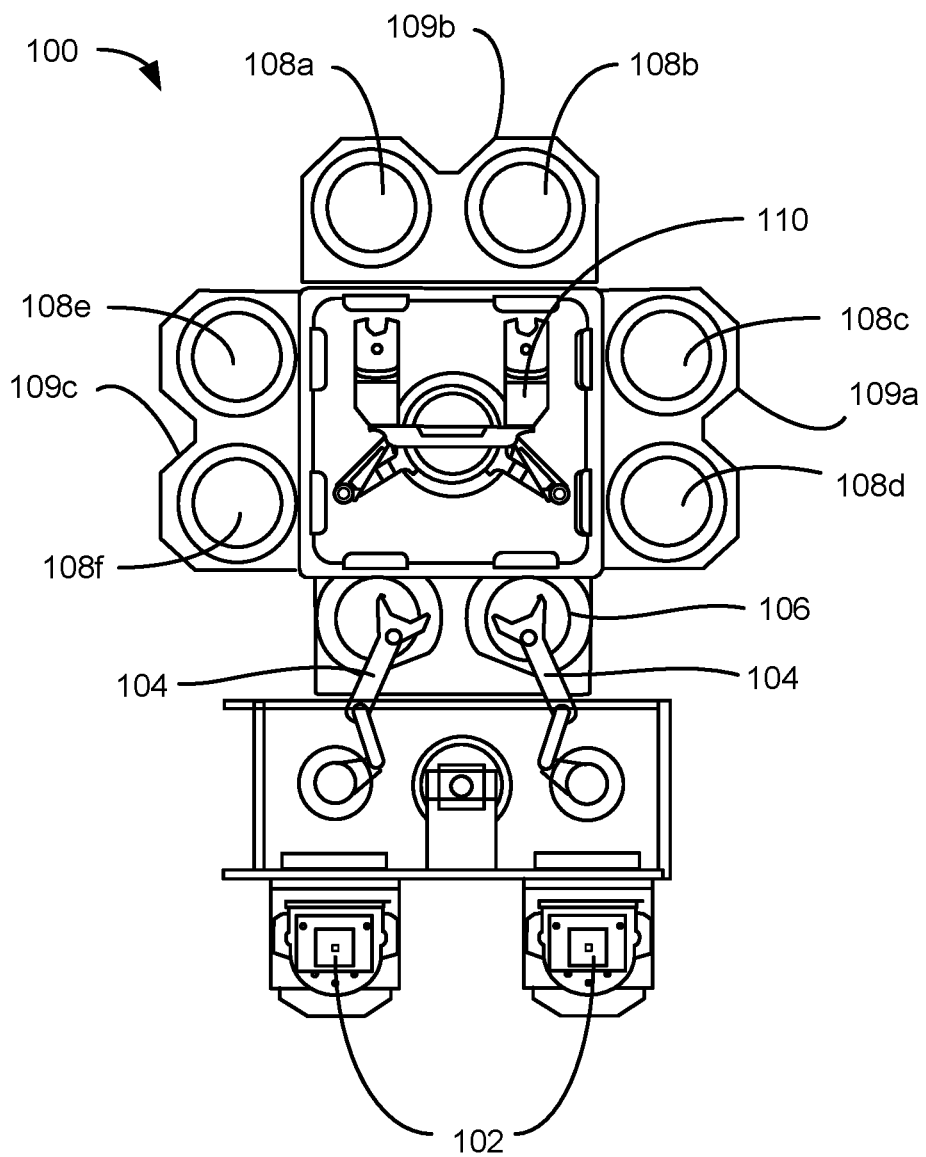
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As electronic devices continue to shrink in size, transitioning to future technology nodes has uncovered challenges with scaling semiconductor materials. For example, copper has been used as an interconnect or wiring material based on the relatively low resistivity of the metal. However, as critical dimensions continue to reduce, copper has been shown to exhibit increasing resistivity. For relatively larger line widths, copper can maintain lower resistivity to maintain device performance. Although, as wiring reduces below 50 nm, the resistivity of copper can increase dramatically due to surface scattering. Scattering can relate to electrons moving with a flow of current. When electrons reach sidewalls, the electrons may lose momentum in a sense, and the effective resistance begins to increase. At lower line widths, the effective electron mean free path reduces and scattering increases, and for copper the resistivity can increase more than five times beyond standard bulk resistivity.

Because copper is characterized by low resistivity, the material may still outperform other materials at larger line widths. When transitioning to smaller line widths, the dramatic increase in copper resistivity may cause other materials to begin to outperform copper. For example, ruthenium may be characterized by less dramatic increases in resistivity during device scaling, which may become less than copper at particular line widths. However, ruthenium may often be processed with chlorine-based etch processes, which may cause surface roughness of ruthenium to increase. At material interfaces, this increased roughness may detrimentally affect resistivity by further increasing scattering.

The present technology overcomes these issues by performing an etch process that may remove ruthenium in discreet layers, and which may be performed selectively to surrounding materials, including a number of oxide materials. By removing ruthenium by evolving or releasing oxidized materials, the present technology may provide an etch process that provides a smoother interface surface compared to many conventional chemical etches. Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with any specific processes or materials alone. Moreover, although an exemplary chamber is described to provide foundation for the present technology, it is to be understood that the present technology can be performed in virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in one or more chamber separated from the fabrication system shown in different embodiments. It will be appreciated that additional configurations of deposition, etching, annealing, and curing chambers for dielectric films are contemplated by system 100.

Figure 2A:
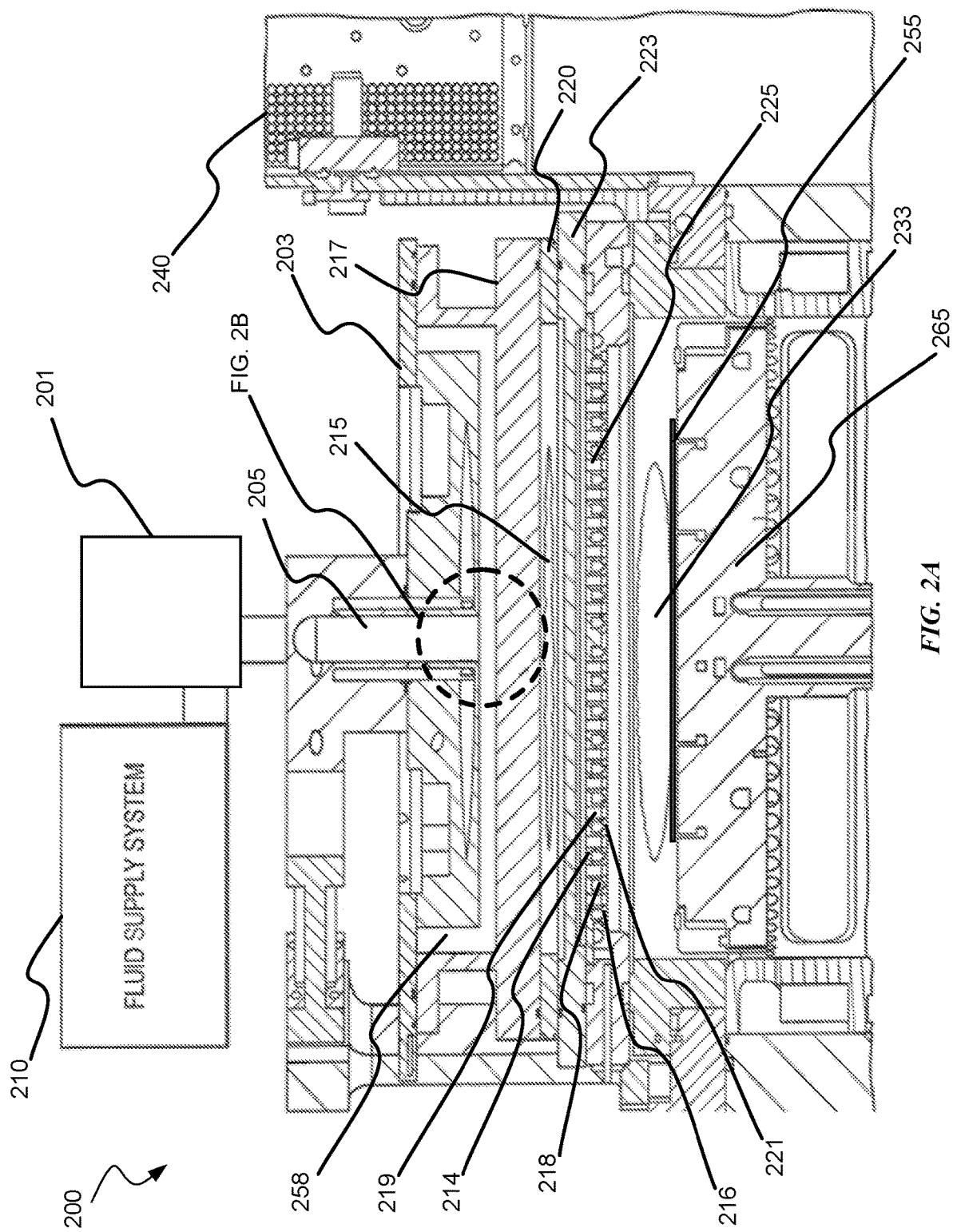
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, for example, a process gas may be flowed into the first plasma region 215 through a gas inlet assembly 205. A remote plasma system 201 may optionally be included in the system, and may process a first gas which then travels through gas inlet assembly 205. The inlet assembly 205 may include two or more distinct gas supply channels where the second channel may bypass the remote plasma system 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the remote plasma system 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively-coupled plasma to be formed in the first plasma region. A baffle may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency ("RF") range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
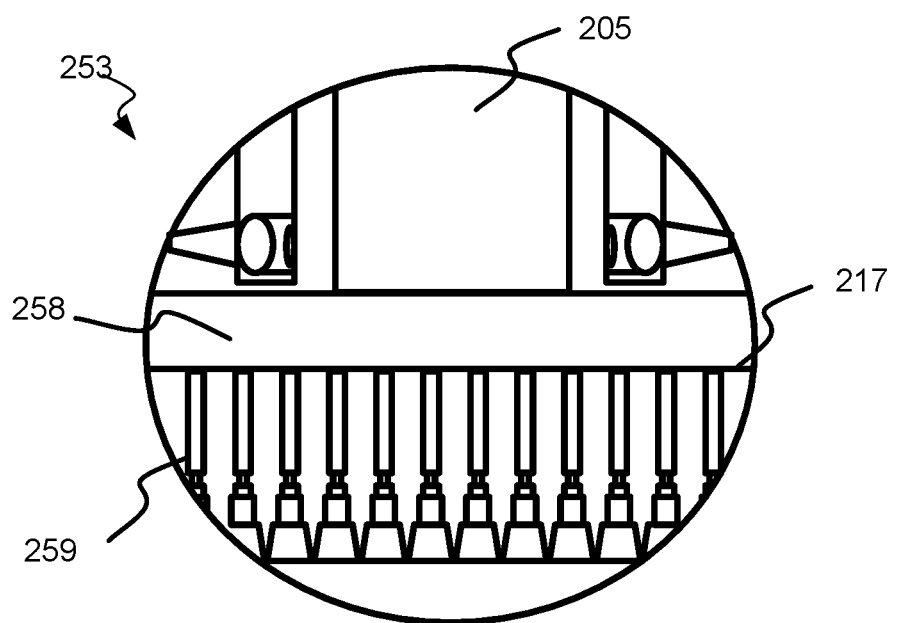
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
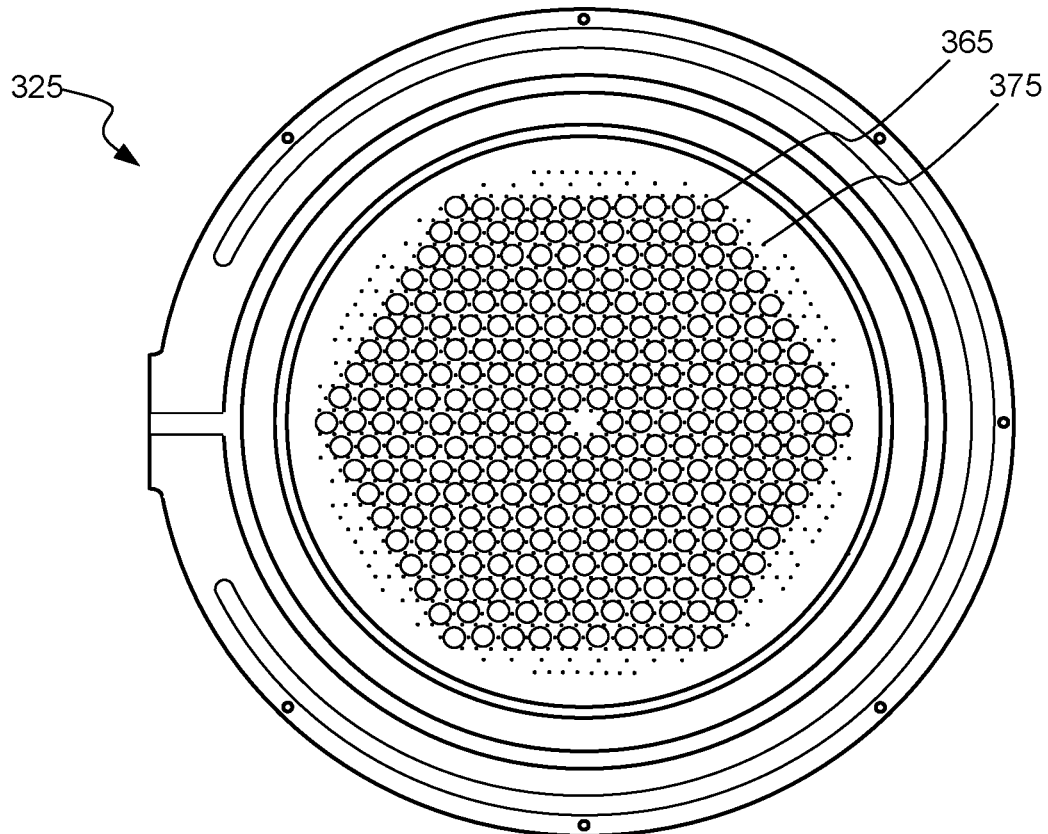
FIG. 3 shows a bottom plan view of an exemplary showerhead according to some embodiments of the present technology.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
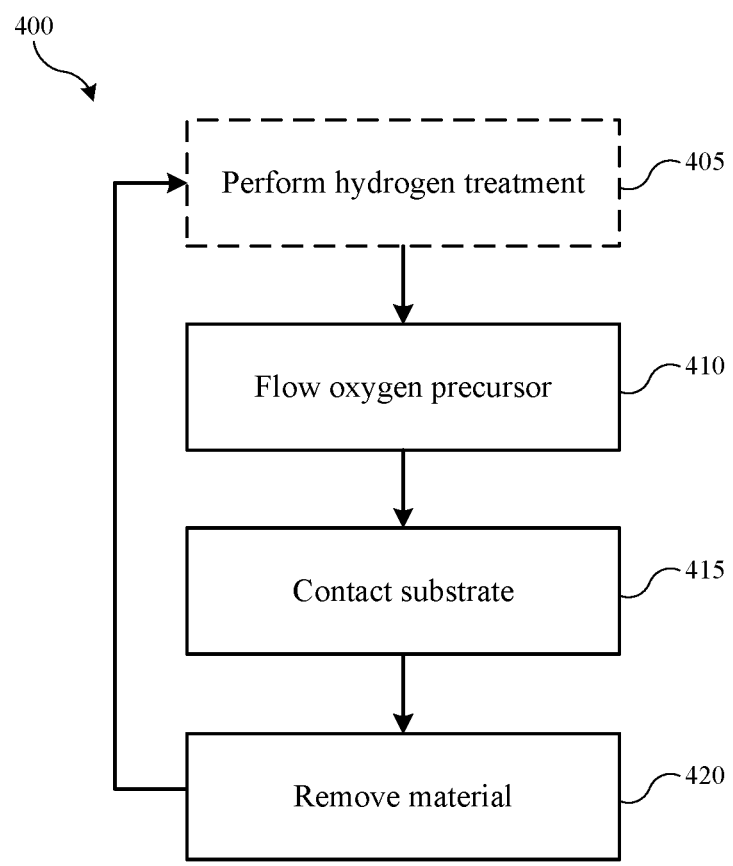
FIG. 4 shows exemplary operations in a method according to some embodiments of the present technology.

The chamber discussed previously may be used in performing exemplary methods, including etching methods, although any number of chambers may be configured to perform one or more aspects used in embodiments of the present technology. Turning to FIG. 4 is shown exemplary operations in a method 400 according to embodiments of the present technology. Method 400 may include one or more operations prior to the initiation of the method, including front end processing, deposition, etching, polishing, cleaning, or any other operations that may be performed prior to the described operations. The method may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 400 may describe operations shown schematically in FIGS. 5A-5C, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
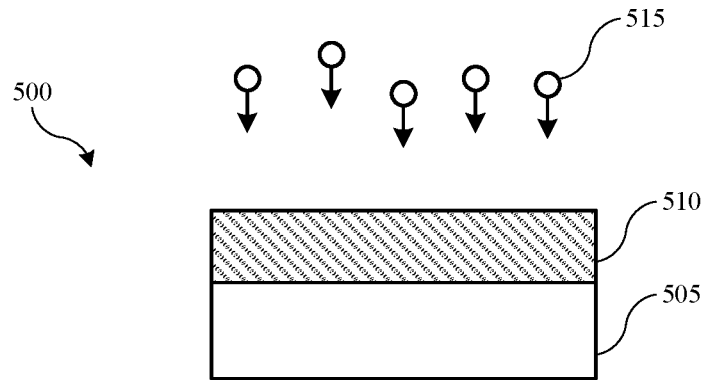
FIGS. 5A-5C show schematic cross-sectional views of materials etched according to some embodiments of the present technology.

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structures on which a ruthenium-containing material removal operation may be performed. Exemplary semiconductor structures may include a trench, via, or other recessed features that may include one or more exposed materials. For example, an exemplary substrate may contain silicon or some other semiconductor substrate material as well as interlayer dielectric materials through which a recess, trench, via, or isolation structure may be formed. Exposed materials at any time during the etch process may be or include metal materials, one or more dielectric materials, a contact material, a transistor material, or any other material that may be used in semiconductor processes.

For example, although shown as a generic layer, FIG. 5A may illustrate a layer of ruthenium 510 overlying substrate 505 or some other semiconductor material. Although the remaining disclosure will reference ruthenium, it is to be understood that the ruthenium material 510 may also be ruthenium oxide, whether a native oxide or oxidized surface. Substrate 505 may illustrate a dielectric material overlying one or more other structures on a substrate, and it is to be understood that any number of materials may be formed beneath the structure illustrated. In some embodiments dielectric materials may be or include silicon oxide, or any other oxide or nitride through which patterning may occur. It is to be understood that the noted structure is not intended to be limiting, and any of a variety of other semiconductor structures including ruthenium-containing materials or other metal-containing materials are similarly encompassed. Other exemplary structures may include two-dimensional and three-dimensional structures common in semiconductor manufacturing, and within which a ruthenium-containing material such as ruthenium metal or oxidized ruthenium is to be removed relative to one or more other materials, as the present technology may selectively remove ruthenium-containing materials relative to other exposed materials, such as silicon oxide, titanium oxide, tungsten oxide, and any of the other materials discussed elsewhere, among a variety of other exposed materials. Additionally, although a high-aspect-ratio structure may benefit from the present technology, the technology may be equally applicable to lower aspect ratios and any other structures.

Method 400 may be performed to remove an exposed ruthenium-containing material in embodiments of the present technology. The methods may include specific operations for the removal of ruthenium metal. Although the remaining disclosure will routinely discuss ruthenium and ruthenium oxide, it is to be understood that other metals may similarly be processed by some embodiments of the present technology. In some embodiments, the methods may include a multiple-operation etch process, which may control etching of the ruthenium relative to other exposed materials, such as dielectric material, for example silicon oxide, as well as any underlying contact material, such as a conductive material used in the structure, which may be coupled with one or more device structures.

As noted previously, an amount of oxidation may be present on the surface of the ruthenium 510, and may be removed prior to proceeding with the etch process. Whether the oxidation is a native oxide or residual oxidation from previous processing, including a previous cycle of method 400, removing the oxidation may facilitate formation of particular oxide species, which may allow increased removal of the ruthenium in some embodiments of the present technology. Accordingly, in some embodiments, method 400 may include contacting the substrate with a hydrogen-containing precursor at optional operation 405. The hydrogen may reduce the oxidation producing water vapor that may be purged from the chamber, and leaving a surface of ruthenium exposed on the substrate.

Method 400 may include flowing an oxygen-containing precursor into a semiconductor processing chamber housing the described substrate at operation 410. In some embodiments the oxygen-containing precursor may be flowed directly to contact the substrate, although in some embodiments a plasma may be formed of the oxygen-containing precursor. The plasma may be formed remotely, or within a processing region of the semiconductor processing chamber in which the substrate is housed. The oxygen-containing precursor may be flowed through a remote plasma region of the processing chamber, such as region 215 described above, and a plasma may be formed of the oxygen-containing precursor to produce plasma effluents. Although a substrate-level plasma may be produced, in some embodiments the plasma may be a remote plasma, which may protect exposed substrate materials from ion bombardment that may occur due to the substrate-level plasma.

Figure 5B:
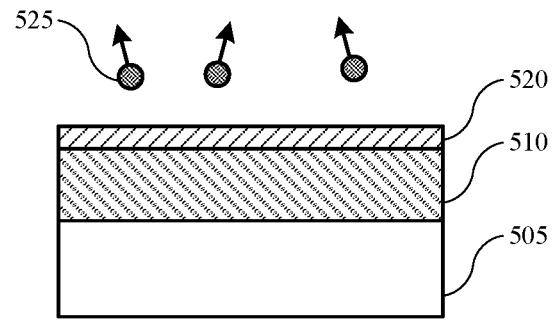

Whether plasma-enhanced or not, at operation 410, the oxygen-containing precursor or plasma effluents of the oxygen-containing precursor may be delivered to the substrate processing region, where the effluents may contact the semiconductor substrate including an exposed ruthenium-containing material, such as an exposed region of ruthenium, at operation 415. The contacting may produce an oxidized material, such as an oxidized surface on the ruthenium or a ruthenium oxide material, such as by converting the exposed ruthenium on the substrate. In some embodiments when a plasma is formed, subsequent the oxidation, the plasma may be extinguished, and the chamber may be purged. As shown in FIG. 5A, oxygen material, or oxygen plasma effluents 515 may be flowed to contact the exposed ruthenium material 510, which may convert an exposed surface of ruthenium 510 into an oxidized ruthenium material 520, as illustrated in FIG. 5B.

The present technology may control one or more conditions during the oxidation to produce a particular oxide species of ruthenium. For example, in some embodiments of the present technology, the contacting operation may be performed to produce an amount of ruthenium tetroxide along a surface of the substrate. By producing ruthenium tetroxide, such as instead of ruthenium dioxide, the present technology may allow ruthenium to be removed selectively over a number of other exposed materials on the substrate. For example, unlike ruthenium dioxide, which has a denser structure that may limit removal during processing, ruthenium tetroxide may be characterized by a relatively low boiling point. Accordingly, when oxidation of the ruthenium may be performed to produce ruthenium tetroxide, the produced material may be caused to evaporate from a surface of the substrate. Hence, in some embodiments, method 400 may include vaporizing at least a portion of the ruthenium tetroxide from the substrate to remove the volatile material from the underlying ruthenium or substrate materials at operation 420. As illustrated in FIG. 5B, the ruthenium tetroxide 525 may be evaporated from the surface of the structure due to processing conditions.

For example, method 400 may be performed at a temperature sufficient to cause produced ruthenium tetroxide to vaporize from the surface. Accordingly, in some embodiments method 400 may be performed at a temperature of greater than or about 60° C., and may be performed at a temperature of greater than or about 80° C., greater than or about 100° C., greater than or about 110° C., greater than or about 120° C., greater than or about 130° C., greater than or about 140° C., greater than or about 150° C., or more. However, as temperature increases, the oxidation process may transition to producing higher density ruthenium dioxide, which may not be evaporated due to a significantly higher boiling point. Accordingly, in some embodiments the method may be performed at a temperature of less than or about 170° C., and may be performed at a temperature of less than or about 160° C., less than or about 150° C., or less. By maintaining the temperature within a window that may be high enough to allow ruthenium tetroxide to evaporate, while maintaining the temperature low enough to limit or prevent production of ruthenium dioxide, the present technology may allow ruthenium to be removed from the substrate.

Advantageously, as many other materials may not evaporate at operating temperatures of method 400, such as between about 100° C. and about 150° C., for example, the method may selectively remove ruthenium, while essentially or fully maintaining other exposed materials, including silicon oxide, titanium oxide, tungsten oxide, or other materials. Exposed metals may also be maintained by method 400, which may only oxidize a surface of the material, but may not otherwise cause the material to be etched. As noted above, in some embodiments method 400 may not include plasma enhancing the oxygen-containing precursor, and the method may be performed while maintaining a plasma-free environment. This may further limit damage or removal of other exposed materials in some embodiments.

Figure 5C:
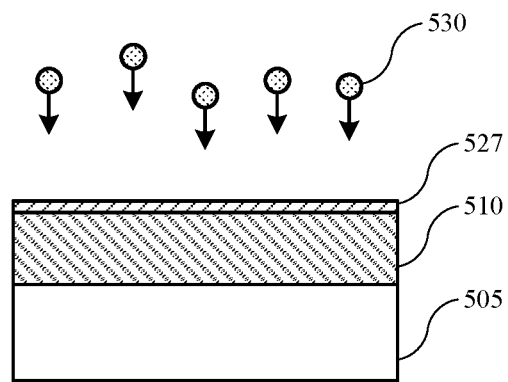

Subsequent the oxidation operation, the delivery of the oxygen material may be halted. Based on the oxidation of ruthenium, residual oxidized ruthenium may remain subsequent vaporization of the ruthenium tetroxide, and which may not be a volatile species. This may limit the etch from proceeding continuously, or may slow the etch process. Accordingly, in some embodiments, the method may include contacting the residual oxidized ruthenium with a hydrogen-containing precursor, prior to continuing delivery of the oxygen-containing precursor. This may produce volatile water vapor, which may be purged from the processing chamber, and may reduce the surface to ruthenium. As illustrated in FIG. 5C, hydrogen-containing material 520 may be flowed to residual oxidized ruthenium material 527, which may reduce the surface to ruthenium or remove the oxidized material, such as illustrated in FIG. 5A, although to a lesser amount, or which may complete the removal operation. The contacting may be similar or identical to the hydrogen pre-treatment as noted previously with optional operation 405. Accordingly, in some embodiments the method may begin and/or end with a hydrogen treatment.

The process may be repeated in one or more cycles to remove additional layers of ruthenium from the substrate.

The precursors during each of the two-step operation may include oxygen-containing precursors, which may include any oxygen-containing materials in some embodiments. For example, non-limiting oxygen-containing precursors may include diatomic oxygen, ozone, water, an alcohol, hydrogen peroxide, nitrous oxide, or any other oxygen-containing material. The hydrogen-containing material may be or include diatomic hydrogen, or any other hydrogen-containing material, including hydrogen-containing materials including oxygen or nitrogen, for example. The precursors may also be flowed with any number of additional precursors or carrier gases including nitrogen, argon, helium, or any number of additional materials, although in some embodiments the precursors may be limited to control side reactions or other aspects that may impact selectivity.

As noted previously, processing conditions may impact and facilitate etching according to the present technology. In addition to temperature, the pressure within the chamber may also affect the operations performed as well as affect at what temperature the ruthenium tetroxide may evolve from the ruthenium surface. Accordingly, in some embodiments, the pressure may be maintained at a pressure of greater than or about 1 Torr, and may be maintained at greater than or about 2 Torr, greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, or higher. The pressure may also be maintained at any pressure within these ranges, within smaller ranges encompassed by these ranges, or between any of these ranges.

Figure 6:
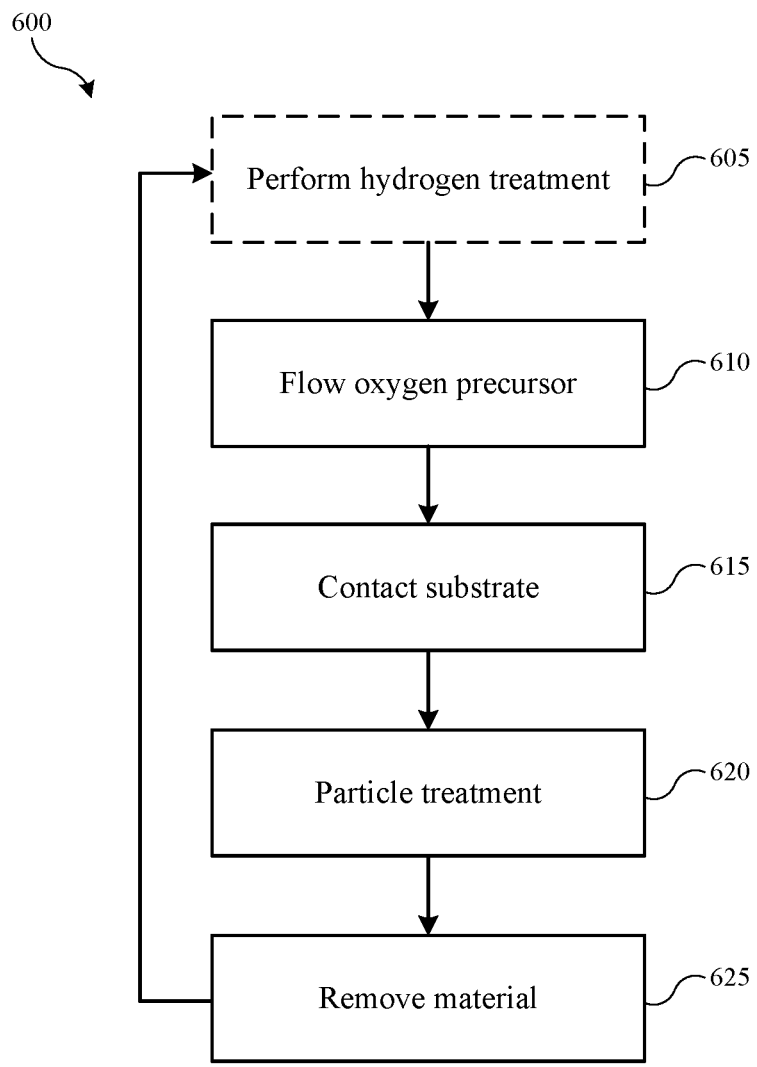
FIG. 6 shows exemplary operations in a method according to some embodiments of the present technology.

The present technology may also provide additional mechanisms for the removal of ruthenium from a semiconductor substrate. Turning to FIG. 6 is shown a method 600 for etching ruthenium-containing materials according to embodiments of the present technology. Method 600 may describe operations shown schematically in FIGS. 7A-7C, the illustrations of which will be described in conjunction with the operations of method 600. It is to be understood that the figures illustrate only partial schematic views, and a substrate may contain any number of additional materials and features having a variety of characteristics and aspects as illustrated in the figures.

Figure 7A:
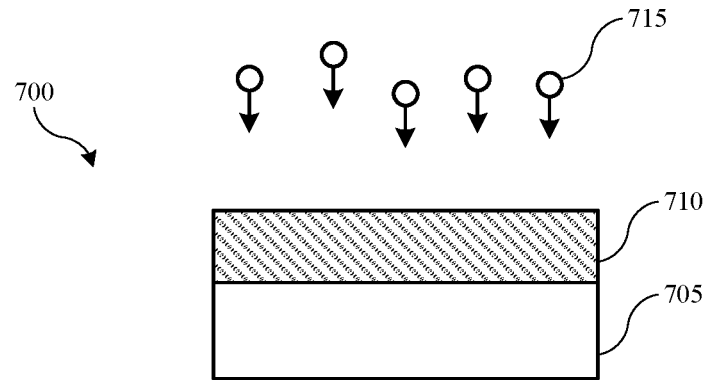
FIGS. 7A-7C show schematic cross-sectional views of materials etched according to some embodiments of the present technology.

Method 600 may or may not involve optional operations to develop the semiconductor structure to a particular fabrication operation. Additionally, method 600 may include any or all of the operations discussed previously with regard to method 400, and may include any of the process conditions discussed above. It is to be understood that method 600 may be performed on any number of semiconductor structures or substrates 705, as illustrated in FIG. 7A, and as discussed above for method 400. Any substrate noted previously or used in semiconductor processing may be encompassed, for which the substrate includes a layer of ruthenium-containing material 710, such as ruthenium metal, exposed on the substrate.

Figure 7B:
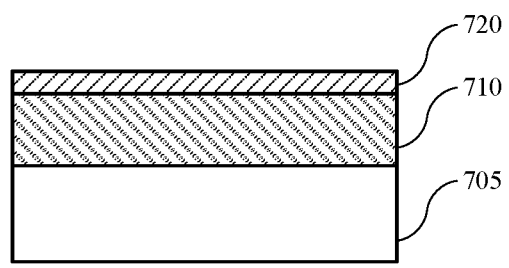

Similar to method 400, the ruthenium may have residual oxidized material, native oxide, or other aspects that may be removed in optional operation 605, which may be as discussed above with respect to operation 405. At operation 610, an oxygen-containing precursor may be flowed into the processing chamber. As discussed above with operation 410, the oxygen-containing precursor may or may not be plasma enhanced, and the oxygen-containing precursor may be any of the materials noted previously. The oxygen-containing precursor, or plasma effluents of the oxygen-containing precursor, may contact the substrate at operation 615, and may contact the exposed ruthenium. As illustrated in FIG. 7A, oxygen-containing materials 715 may contact ruthenium 710. As illustrated in FIG. 7B, the oxygen-containing materials may be delivered to produce ruthenium tetroxide 720 on the surface of the ruthenium.

While method 400 may provide operations allowing volatile ruthenium tetroxide to evolve from the ruthenium material, method 600 may be performed to remove controlled, discreet layers of ruthenium by maintaining ruthenium tetroxide on the surface of the substrate, such as illustrated in FIG. 7B. For example, method 600 may be performed at any of the processing conditions discussed above, such as in relation to method 400. Additionally, in some embodiments method 600 may be performed at temperatures below a vaporization temperature of ruthenium tetroxide. For example, method 600 may be performed at a temperature that is less than or about 50° C., and may be performed at a temperature that is less than or about 40° C., less than or about 30° C., less than or about 25° C., less than or about 20° C., less than or about 15° C., less than or about 10° C., less than or about 5° C., less than or about 0° C., or less. This may allow a layer of ruthenium tetroxide to form and remain across the surface of the ruthenium.

Figure 7C:
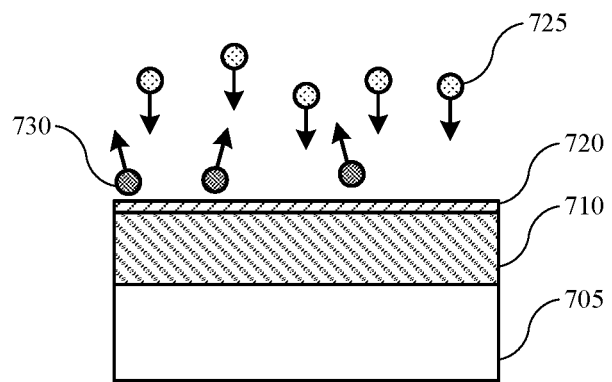

At operation 620, the method may include performing a particle treatment with an inert precursor. A plasma may be formed in a remote portion of the semiconductor processing chamber, or may be formed within the processing region of the semiconductor processing chamber. Although any number of reactive materials may be used, in some embodiments, an inert precursor, such as argon, helium, or some other material, may be used and delivered to the substrate. For example, a bias may be engaged to direct plasma effluents to the substrate surface, which may be operating as a cathode within the chamber, for example. The plasma effluents may contact the ruthenium tetroxide, which may provide sufficient energy to release the ruthenium tetroxide from the surface of the ruthenium, and which may remove the material at operation 625. As illustrated in FIG. 7C, inert effluents 725 may contact the substrate surface, and cause ruthenium tetroxide 730 to be released from the surface, and which may be purged from the processing chamber. This may remove a layer of ruthenium from the substrate, and may expose additional ruthenium.

By maintaining the layer of ruthenium tetroxide on the surface, additional oxidation may be controlled, and which may allow a layered etch process. The method may be repeated any number of times to remove a desired amount of ruthenium. As discussed above, additional oxidized material, which may not be ruthenium tetroxide, may remain on the substrate surface subsequent the release operation. An additional operation including contacting the residual material with hydrogen, or hydrogen effluents, may be performed as discussed above, to reduce the surface to ruthenium. Accordingly, as discussed above, and for any of the methods according to the present technology, the cycles may or may not include a hydrogen treatment during each cycle, or some cycles may include a hydrogen treatment, while others may directly proceed with an additional oxygen exposure.

When plasma effluents are utilized during one or both of the operations, such as with the oxygen-containing precursor and/or the inert plasma generation, plasma power may be maintained at less than or about 500 W. By maintaining a lower plasma power, sputtering underlying ruthenium may be controlled, and interactions may be limited to superficial physical reactions, which may better limit the extent of removal through the ruthenium-containing material. Consequently, in some embodiments of any of the methods discussed in which a plasma is formed, the plasma power may be maintained at less than or about 450 W, less than or about 400 W, less than or about 350 W, less than or about 300 W, less than or about 250 W, less than or about 200 W, less than or about 150 W, less than or about 100 W, or less. By performing etch operations according to embodiments of the present technology, substantially self-limiting removal operations may be performed to precisely remove ruthenium, and which may be performed at temperatures that may limit removal of additionally exposed materials across a substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
flowing an oxygen-containing precursor into a processing region of a semiconductor processing chamber;
contacting a substrate housed in the processing region with the oxygen-containing precursor, wherein the substrate comprises an exposed region of ruthenium, and wherein the contacting produces ruthenium tetroxide;
vaporizing the ruthenium tetroxide from a surface of the exposed region of ruthenium, wherein an amount of oxidized ruthenium remains;
contacting the amount of oxidized ruthenium with a hydrogen-containing precursor; and
removing the amount of oxidized ruthenium, wherein the etching method is performed while maintaining a plasma-free environment in the processing region, and wherein a temperature within the processing region is maintained at less than or about 10° C.

2. The etching method of claim 1, wherein a temperature within the processing region is maintained at less than or about 0° C.

3. The etching method of claim 1, wherein the hydrogen-containing precursor comprises diatomic hydrogen.

4. The etching method of claim 1, further comprising an additional operation of:
contacting the substrate with the hydrogen-containing precursor prior to flowing the oxygen-containing precursor, wherein the hydrogen-containing precursor exposes the exposed region of ruthenium.

5. The etching method of claim 1, wherein removing the amount of oxidized ruthenium exposes additional ruthenium, and wherein the method is repeated for an additional cycle.

6. The etching method claim 1, wherein the amount of oxidized ruthenium is removed selective to an exposed region of silicon oxide, titanium oxide, or tungsten oxide.

7. The etching method claim 1, wherein a pressure within the semiconductor processing chamber is maintained at greater than or about 1 Torr.

8. The etching method of claim 1, wherein the oxygen-containing precursor comprises diatomic oxygen, ozone, water, an alcohol, hydrogen peroxide, or nitrous oxide.

9. An etching method comprising:
flowing an oxygen-containing precursor into a processing region of a semiconductor processing chamber;
contacting a substrate housed in the processing region with the oxygen-containing precursor, wherein the substrate comprises an exposed region of ruthenium, and wherein the contacting produces ruthenium tetroxide;
performing a particle treatment with an inert precursor within the processing region of the semiconductor processing chamber, wherein the inert precursor comprises argon or helium;
contacting the ruthenium tetroxide with the inert precursor; and
removing the ruthenium tetroxide, wherein the etching method is performed while maintaining a plasma-free environment in the processing region, and wherein a temperature within the processing region is maintained at less than or about 10° C.

10. The etching method of claim 9, wherein a temperature within the semiconductor processing chamber is maintained at less than or about 25 about 0° C.

11. The etching method of claim 9, wherein removing the ruthenium tetroxide exposes additional ruthenium, and wherein the method is repeated for an additional cycle.

12. The etching method of claim 9, further comprising an additional operation of:
contacting the substrate with a hydrogen-containing precursor prior to flowing the oxygen-containing precursor, wherein the hydrogen-containing precursor exposes the exposed region of ruthenium.

13. The etching method of claim 9, wherein the oxygen-containing precursor comprises diatomic oxygen, ozone, water, an alcohol, hydrogen peroxide, or nitrous oxide.

14. An etching method comprising:
    contacting a substrate disposed within a processing region of a semiconductor processing chamber with a hydrogen-containing precursor, wherein the contacting exposes ruthenium metal on the substrate;
    flowing an oxygen-containing precursor into the processing region of the semiconductor processing chamber;
    contacting the ruthenium metal exposed on the substrate with the oxygen-containing precursor, wherein the contacting produces ruthenium tetroxide;
    vaporizing the ruthenium tetroxide from a surface of the ruthenium metal, wherein an amount of oxidized ruthenium remains;
    contacting the amount of oxidized ruthenium with a second hydrogen-containing precursor; and
    removing the amount of oxidized ruthenium, wherein the etching method is performed while maintaining a plasma-free environment in the processing region, and wherein a temperature within the processing region is maintained at less than or about 10° C.

15. The etching method of claim 14, wherein a temperature within the processing region is maintained at less than or about 0° C.

16. The etching method of claim 14, further comprising:
    repeating the method for at least one additional cycle.

17. The etching method of claim 14, wherein the oxygen-containing precursor comprises diatomic oxygen, ozone, water, an alcohol, hydrogen peroxide, or nitrous oxide.

\* \* \* \* \*